(12) United States Patent
Mulligan et al.

(10) Patent No.: US 10,415,904 B1
(45) Date of Patent: Sep. 17, 2019

(54) FIRING WEAPONS BONDED WITH DIAMOND-LIKE CARBON SOLID AND METHODS FOR PRODUCTION THEREOF

(71) Applicant: U.S. Government as Represented by the Secretary of the Army, Picatinny Arsenal, Dover, NJ (US)

(72) Inventors: Christopher Mulligan, Mechanicville, NY (US); Adam Foltz, Long Valley, NJ (US); Douglas Witkowski, Summit, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 450 days.

(21) Appl. No.: 15/134,439

(22) Filed: Apr. 21, 2016

Related U.S. Application Data (60) Provisional application No. 62/151,570, filed on Apr. 23, 2015.

(51) Int. Cl.
*C23C 16/27* (2006.01)
*F41A 3/12* (2006.01)

(52) U.S. Cl.
CPC ............... *F41A 3/12* (2013.01); *C23C 16/276* (2013.01)

(58) Field of Classification Search
None
See application file for complete search history.

(56) References Cited

U.S. PATENT DOCUMENTS

| | | | |
|---|---|---|---|
| 6,077,572 A | 6/2000 | Hopwood et al. | |
| 6,821,624 B2 * | 11/2004 | Utsumi | C23C 14/024 204/192.1 |
| 8,105,660 B2 | 1/2012 | Tudhope et al. | |
| 8,112,930 B2 | 2/2012 | Sietsema | |
| 8,715,789 B2 | 5/2014 | Upadhyaya et al. | |
| 2009/0178325 A1 * | 7/2009 | Veilleux | F41G 1/36 42/117 |
| 2015/0132539 A1 * | 5/2015 | Bailey | C23C 28/042 428/141 |

OTHER PUBLICATIONS

Dwivedi, Neeraj, et al, Investigation of Properties of Cu containing DLC films produced by PECVD Process, Journal of Physics and Chemistry of Solids, 2012, 308-316, vol. 73, Elsevier.
Robertson, J., Diamond-like Amorphous Carbon, Materials Science and Engineering R37, 2002, 129-281, Elsevier Science B.V. (submitted in 4 parts due to size of file).
Cemin, F, et al, On the Hydrogenated Silicon Carbide (SiCx:H) interlayer properties prompting adhesion of hydrogenated amorphous carbon (a-C:H) deposited on steel, Vacuum, 2014, 180-183, vol. 109, Elsevier.
He, X.M. et al, Investigation of Si-doped diamond-like carbon films synthesized by plasma immersion ion processing, Journal of Vacuum Sciences & Technology, Sep./Oct. 2000, 2143-2148, vol. 18, No. 5, American Vacuum Society.
Chouquet, C. et al, Structural and Mechanical Properties of a-C:H and Si doped a-C:H thin films grown by LF-PECVD, Surface & Coating Technology, 2010, 1339-1346, vol. 204, Elsevier.
Lusk, D., et al, Thick DLC films deposited by PECVD on the internal surface of cylindrical substrates, Diamond and Related Materials, 2008, 1613-1621, vol. 17, Elsevier.
Chhowalla, M., et al, Influence of Ion Energy and Substrate Temperature on the Optical and Electronic Properties of Tetrahedral Amorphous Carbon (ta-C) films, J. App. Phys, Jan. 1997, 139-145, vol. 81(1), American Institute of Physics.
Bull, S.J., Techniques for Improving Thin Film Adhesion, Vacuum, 1992, 517-520, vol. 43 (5-7), Pergamon Press Ltd., Great Britain.
Dekempeneer, E., et al, Abrasion Resistant Low Friction Diamondlike Multilayers, Surface and Coating Technology, 2001, 669-673, vol. 142-144, Elsevier.
Ladwig, A., et al Atmospheric Plasma Deposition of Diamond-Like Carbon Coatings, Diamond & Related Materials, 2009, Elservier.
Shaffer, S.J., et al, Tribological Performance of Various Coatings in Unlubricated Sliding for Use in Small Arms Actions Components—A Case Study, 2007, WEAR, 1281-1290, vol. 263, Elsevier.
Dai, W., et al, Investigation of the Microstructure, mechanical properties and tribological behavioers of Ti-containing diamondlike carbon films fabricated by a hybrid ion beam method., Thin Solid Films, 2012, 2057-2063, vol. 520 Elsevier.
248 SHOOTER, Diamond Like Carbon The DLC Solution, Jun. 26, 2014, available at http://gatdaily.com/diamond-like-carbon-the-dlc-solution, last accessed Mar. 28, 2016.
ASTM B 571-97, Standard Practice for Qualitative Adhesion Testing of Metallic Coatings, 2008, ASTM International.
Test Operating Procedure (TOP) 3-2-045 Small Arms—Hand and Shoulder Weapons and Machine Guns, available at http://www.dtic.mil/dtic/tr/fulltext/u2/a481861.pdf, last accessed Apr. 20, 2016.
TT-C-490F, Chemical Coversion Coatings and Pretreatments for Metallic Substrates (Base for Organic Coatings), available at http://quicksearch.dla.mil/qsDocDetails.aspx?ident_number=281441, last accessed Apr. 20, 2016.
Performance Arms, What is DLC, http://www.perfarms.com/media.html, last accessed Apr. 20, 2016.
Performance Arms, About Diamond Coat, available at http://www.perfarms.com/about-diamond-coat.html, last accessed Apr. 20, 2016.

(Continued)

*Primary Examiner* — Sheeba Ahmed
(74) *Attorney, Agent, or Firm* — Lisa H Wang (57) ABSTRACT

A lubricant free firing weapon is provided having amorphous, solid, diamond-like carbon coating (DLC) containing sp3, sp2 carbons and hydrogen bonded to the metallic operating parts. Such firing weapons may further include physical modifications to the bolt carrier rails to enhance the expulsion of sand/dust on the bolt carrier under extreme environments. Also provided herein are plasma enhanced chemical vapor deposition processes for producing such lubricant free weapons having coat thicknesses of 1 μm-25 μm which allows for reliable operation under all environmental conditions including extreme environments such as hot/cold and sand/dust without the need for lubrication.

19 Claims, 7 Drawing Sheets

(56) References Cited

OTHER PUBLICATIONS

M. Roy, Protective Hard Coatings for Tribological Applications, Materials Under Extreme Conditions, Science Direct, 2017. Available at https://www.sciencedirect.com/topics/engineering/amorphous-hydrogenated-carbon (last accessed May 28, 2019).

* cited by examiner

1. Baseline

2. Dimple

3. Helical 4. 90 Degree 5. 45 Degree 6. 30 Degree

FIRING WEAPONS BONDED WITH DIAMOND-LIKE CARBON SOLID AND METHODS FOR PRODUCTION THEREOF

CROSS REFERENCE TO RELATED APPLICATIONS

The present application is a non-provisional application that claims the benefit of the provisional patent application entitled "Diamond-Like Carbon Solid Lubricant Coating for Armament Weapons Systems" filed Apr. 23, 2015, as Ser. No. 62/151,570.

RIGHTS OF THE GOVERNMENT

The inventions described herein may be manufactured and used by or for the United States Government for government purposes without payment of any royalties.

FIELD OF INVENTION

The present invention relates generally to modifying firing weapons to enhance longevity and wear resistance. More particularly, the operating components of such firing weapons are coated with solid carbon. The bolt carrier on such weapons are further modified with surface channels to expel dust/grit away from the critical sliding points. Such treatment of contact surfaces and physical modification of sliding points allows for reliable operation under extreme environmental conditions without the need for lubrication.

BACKGROUND OF THE INVENTION

The process of firing a weapon places significant amounts of wear and tear on the weapon and therefore proper cleaning and lubrication of the weapon is necessary for the safety of the shooter and longevity of the weapon. Conventional liquid lubrication performance tends to be degraded in extreme environments such as extreme cold in arctic environments and sand/dust in desert environments. In extreme cold, conventional liquid lubricants increase in viscosity which deteriorates weapon function. In desert environments, conventional liquid lubricants tend to attract and accumulate dust which leads to significant maintainability issues, excessive abrasive wear of components, and reliability issues such as weapon jamming and stoppages.

Past efforts to introduce low-friction coatings into weapon systems have failed to meet all the requirements necessary to enable liquid lubrication free operation. Treatment of sliding contact surfaces on a weapon must provide the correct combination of wear resistance, optimized coefficient of friction, corrosion resistance, as well as anti-fouling behavior in the presence of propellant residue to meet stringent military requirements. Specifically, the wear resistance of the surface treatment must be high enough to last the life of the weapon part when fired without liquid lubrication. The coefficient of friction must be low enough to enable continuous function of the weapon without liquid lubrication with the same or better characteristics such as cyclic and malfunction rate compared to the baseline oiled weapon system. The corrosion resistance of the treatment must be comparable to or better than the oiled baseline weapon over the life of the part. The anti-fouling behavior must be such that cleaning propellant residue from weapon components is the same or easier than the oiled baseline weapon.

S. J. Shaffer and M. J. Rogers, discloses lab scale studies of commercial coatings for use in small arms. The study included lab scale analysis at ambient and elevated temperatures focused on friction and wear behavior of nickel based coatings, molybdenum disulfide and resin bonded polytetrafluoroethylene (e.g. Teflon®) based materials, among others. In addition there is no disclosure of the extreme low temperature performance, corrosion performance, abrasive friction and wear performance (e.g. in the presence of sand and dust), or anti-fouling behavior of the coatings, which are all necessary characteristics to enable reliable performance in weapon systems.

Thus, a need exists for a weapon having its operating components treated in a manner that improves corrosion, abrasion and wear performance under extreme environmental conditions without the need for lubricants.

The solid lubricant coating described herein enables lubrication free operation of a firing weapon in the relevant environment with the appropriate combination of mechanical properties, wear resistance, coefficient of friction, corrosion resistance, anti-fouling behavior, and mass transport behaviors in the presence of residue and debris for operation in temperatures ranging from −65° F. to 750° F.

SUMMARY OF THE INVENTION

The present invention generally relates to surface treatment of the operating components of firing weapons. Such weapons are bonded with an amorphous, solid, diamond-like carbon (DLC) coat containing 80%-60% carbon and 20%-40% hydrogen (the carbon being 25%-50% sp3 bonded carbon and 50%-75% sp2 bonded carbon), with a hardness of 8-20 GPa. The DLC coating is bonded to the metallic surface of the operating components such that it meets the adhesion standard under ASTM B571, paragraph 13.1 and corrosion standard under ASTM B117. The thickness of the bonded coat may be 1 μm-25 μm and preferably 10 μm-20 μm. The DLC coat may further comprise dopants selected from the group consisting of non-metallic elements (including but not limited to B, Si, N, Ge, and F) and metallic elements (including but not limited to Ti, Cu, and W) or mixtures thereof.

In another embodiment of the invention, the DLC bonded firing weapon comprises physical modification of the bolt carrier rails, wherein said rails comprises a plurality of 0-90 degree angled channels having a width of 0.005 inches to 0.225 inches.

In yet another embodiment of the invention, an adhesive interlayer may be present between the carbon layer and the metallic surface of the operating parts to promote the bond strength of the DLC coat.

In yet another embodiment of the invention, a process is provided for bonding the operating parts with the DLC coating. The process utilizes plasma enhanced chemical vapor deposition to bond the carbon, hydrogen, and optionally dopant atoms onto the metallic surfaces ofthe firing weapon wherein the solidified coating acts as a solid lubricant. The process requires fixturing a component of the firing weapon, heating the part to 200° F.–550° F., pressurizing the chamber with a process gas, applying a voltage across two electrodes on which the substrate (weapon part) is negative resulting in ignition of a plasma from the process gas which deposits the carbon onto the negatively biased firing weapon part.

BRIEF DESCRIPTION OF THE DRAWINGS

The invention will be better understood, and further objects, features, and advantages thereof will become more apparent from the following description of the preferred embodiments, taken in conjunction with the accompanying drawings.

DETAILED DESCRIPTION

Described herein are lubricant free firing weapons bonded with an amorphous, solid, diamond-like carbon (DLC) coat having a hardness of 8-20 GPa. Bonding of the solid DLC coat to the operating components of the firing weapon 1) eliminates the need for conventional liquid lubricants: 2) reduces jamming related failures of sliding components; 3) increases the fatigue life of the parts by eliminating hydrogen embrittlement associated with standard manganese phosphate treatment; 4) protects against corrosion in extreme environments through deposition of fully dense, conforming coating creating a surface free from through cracks and pinholes; and 5) improves maintainability by promoting ease of cleaning and reduction of active maintenance.

DLC Coating.

Carbon comes in many different physical forms (allotropes) such as graphite, diamond, and amorphous carbon. While they are identical from an elemental chemistry perspective, each form is unique in its bonding structure. For example, diamond (sp3 bonding) has carbon atoms arranged in 3 dimensional cubic lattices. In contrast, graphite (sp2 bonding) has a layered, planar structure in which the layers are arranged in a honeycomb lattice. Most forms of DLC coating contain mixtures of sp3 and sp2 bonded carbons. The processing parameters such as the deposition method, process gas, gas pressure, ion energy, ion flux, and substrate temperature control the ratio of sp3 to sp2 bonding along with the general properties of the DLC coating, including both electronic and mechanical properties.

The DLC coating bonded on the operating components of a firing weapon comprises 80%-60% carbon and 20%-40% hydrogen. The carbon comprising 25%-50% sp3 bonded carbon and 75%-50% sp2 bonded carbon. Preferably the DLC coating comprises 75%-65% carbon and 25%-35% hydrogen, wherein the carbon comprises 30%-40% sp3 bonded carbon and 70%-60% sp2 bonded carbon. As used herein, the terms "operating components" or "operating parts" denotes any part of a weapon that moves, slides or contacts another part when the weapon is being used.

Processing Parameters.

Figure 1:
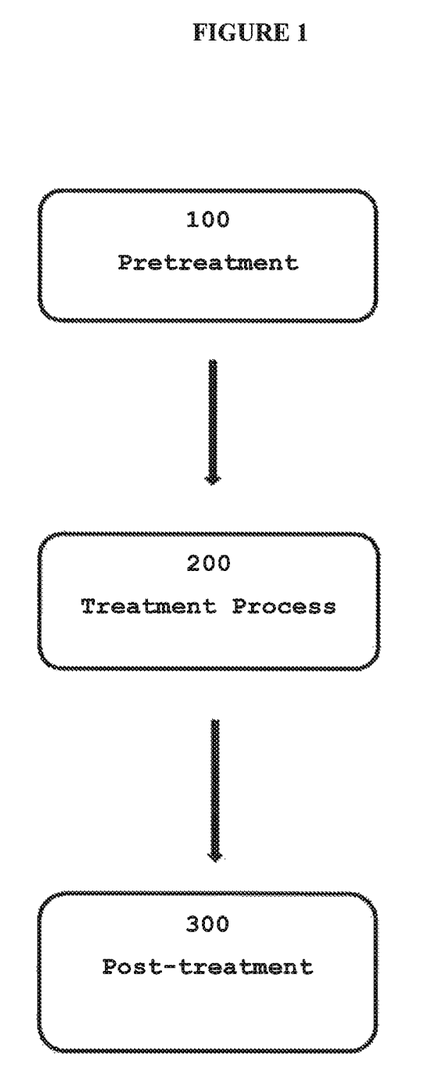
FIG. 1 is a flowchart illustrating the general process for plasma enhanced chemical vapor deposition process.
Figure 2:
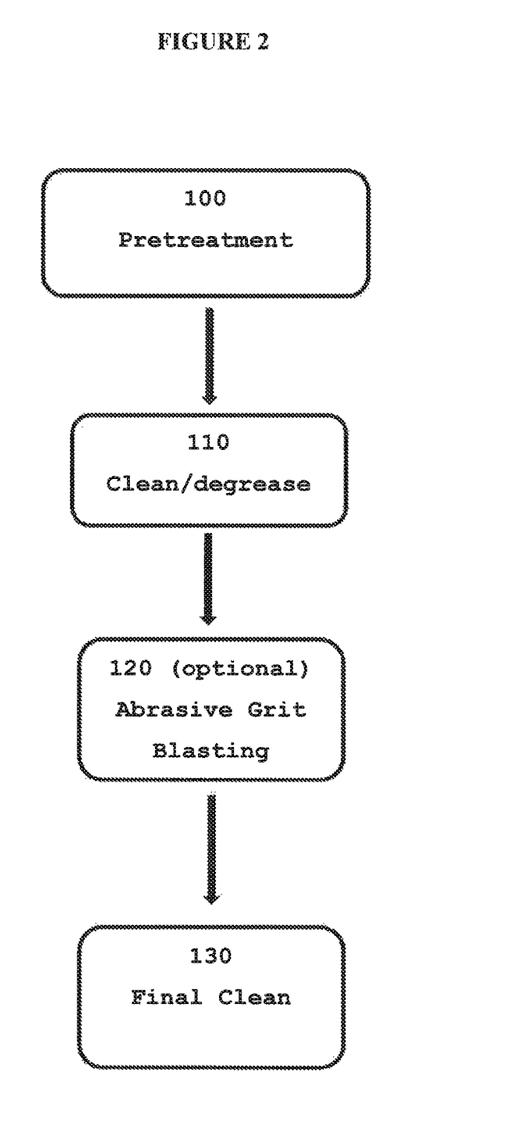
FIG. 2 is a flowchart illustrating the process for pre-treatment of the operating part for the plasma enhanced chemical vapor deposition process.

The process for bonding the DLC coating having the disclosed parameters can be achieved using plasma enhanced chemical vapor deposition process (PECVD). PECVD is a process for depositing thin films from a gas state (vapor) to a solid state on a substrate. Chemical reactions occur after creation of a plasma from the reacting gases. The plasma is generally created by RF (AC) frequency, DC, or pulsed DC discharge between two electrodes, the space between is filled with the reacting gases. The PECVD process as illustrated in FIG. 1 requires three phases: pretreatment 100, treatment 200 and post-treatment 300. In the treatment phase 100, as illustrated in FIG. 2, the weapon part/component is cleaned 110, the surface abrasive grit blasted (optional) 120, and subjected to a final clean to remove any remaining debris/residue 130.

Figure 3:
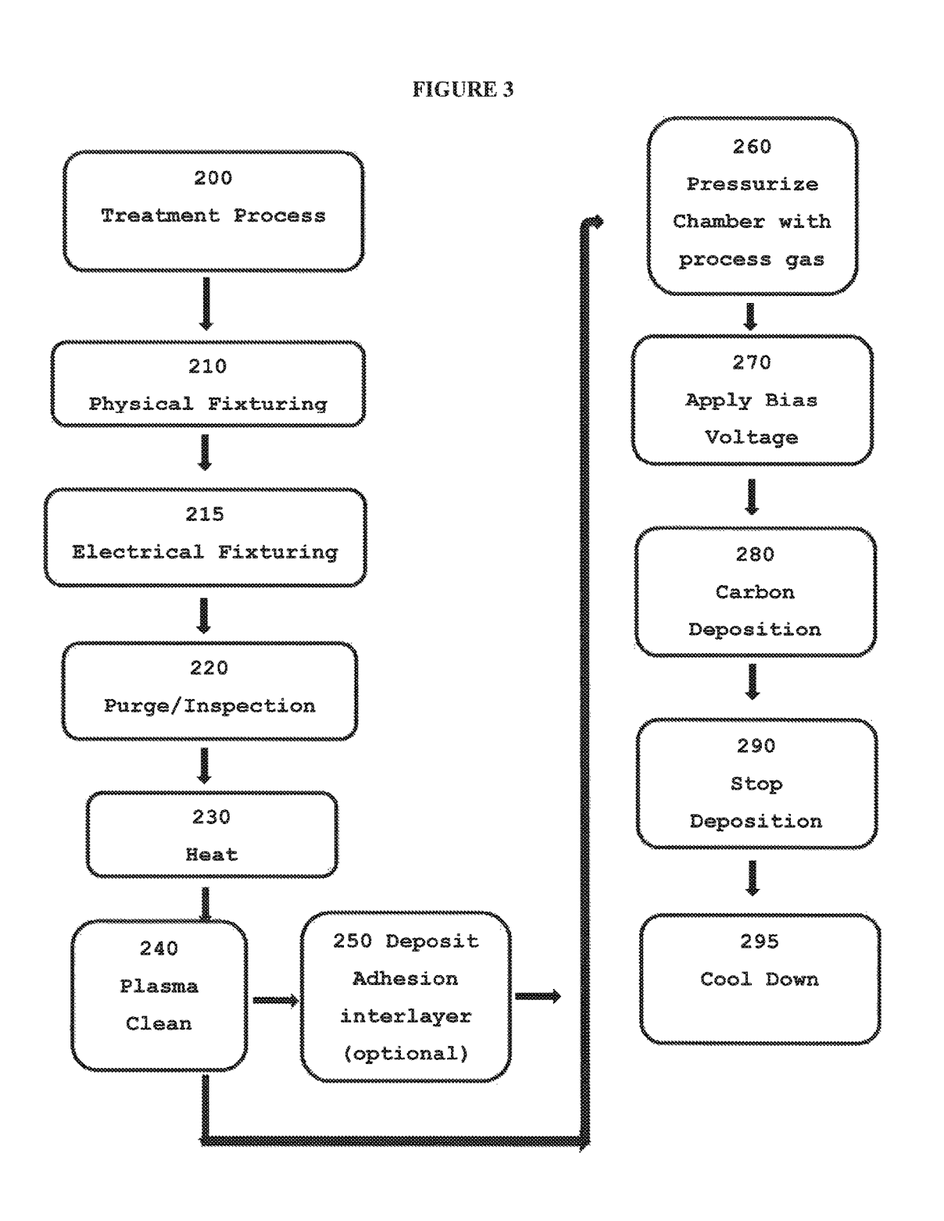
FIG. 3 is a flowchart illustrating the treatment process for plasma enhanced chemical vapor deposition process.

In the second treatment phase 200, as illustrated in FIG. 3, the weapon part is physically fixed in a vacuum chamber 210 such that the treated surface is exposed. The part is further electrically fixed 215 by attaching a cathode wire to a non-critical area (e.g. non-treated or unexposed area) to allow for applying a voltage to the part to create the plasma. The chamber is purged and inspected 220 and the part is heated 230 to not greater than 550° F. The part may be cleaned by removing the native oxide on the surface through a plasma cleaning step 240. An optional adhesion interlayer step 250 may be applied after the plasma cleaning step to promote the adhesive strength of the DLC bond. After the plasma cleaning step, a gas inlet introduces process gases into the chamber to pressurize the chamber 260. A bias voltage 270 is applied to the treated part. Application of voltage creates dissociated molecular, C. and H ions along with un-dissociated precursor gas and neutrally charged radicals that upon subsequent collisions with the weapon part, bond or cross-link the various charged and neutral species onto the treated surface creating the desired sp3 and sp2 bonding arrangement 280. Multiple coating layers may be deposited using different types of process gases. A dopant may be added to the growing film through either co-deposition from a solid target or through addition of a dopant process gas. Once a desired thickness is achieved, the deposition process is terminated 290 and the treated part is cooled down 295. The weapon part is removed, the chamber cleaned and inspected in the post-treatment phase 300. The PECVD coating process may be applied to any metal substrate of the firing weapon including, aluminum, titanium, nickel, cobalt and preferably steel.

The desired thickness of the DLC bonded coating on the operating components is between 1 μm to 25 μm, and preferably 10 μm to 20 μm. The desired thickness of the DLC coat, can be achieved by using different processing gases which may include methane ($CH_4$), acetylene ($C_2H_2$), ethane ($C_2H_6$), ethylene ($C_2H_4$), propane ($C_3H_8$), hexane ($C_6H_{14}$), cyclohexane ($C_6H_{12}$), pentane ($C_5H_{12}$), butane ($C_4H_{10}$), benzene ($C_6H_6$), and mixtures thereof. Various dopant gases can be added to the process gas to co-deposit dopants. Such dopant gases may include non-metallic elements (including but not limited to B, Si, N. Ge, and F) and metallic elements (including but not limited to Ti, Cu, and W). Conversely, the dopants may be introduced by direct physical vapor deposition (PVD) from a solid target. Examples of process gas with dopants include silane ($SiH_4$) and tetramethylsilane ($Si(CH_3)_4$) for adding silicon or germane ($GeH_4$) and tetramethylgermane ($Ge(CH_3)_4$) for adding germanium.

One issue with deposition of pure DLC coatings is the potential for inadequate substrate adhesion. There are a number of strategies for improving the adhesion of DLC coatings as discussed in detail in J. Robertson, "Diamond-like amorphous carbon", Section 9.4, incorporated herein in its entirety. These include (1) in-situ plasma cleaning, (2) the use of high ion energy during the initial deposition to promote coating/substrate intermixing, and (3) introduction of a carbide forming interlayer such as Si. One example of an effective interlayer to promote DLC adhesion is a SiC deposited by PECVD through the use of a hydrocarbon/silane ($SiH_4$) gas precursor mixture or tetramethylsilane (TMS) liquid precursor. Methods describing such processes are disclosed in Cemin, et al., "On the hydrogenated silicon carbide ($SiC_x$:H) interlayer properties prompting adhesion of hydrogenated amorphous carbon (a-C:H) deposited on steel"; He, et al., "Investigation of Si-doped diamond-like carbon films synthesized by plasma immersion ion processing"; C. Chouquet, et al., "Structural and mechanical properties of a-C:H and Si doped a-C:H thin films grown by LF-PECVD"; and D. Lusk, et al., "Thick DLC films deposited by PECVD on the internal surface of cylindrical substrates", the disclosures of which are incorporated herein in its entirety.

The interlayer provides two primary attributes; (1) improved bond strength between substrate: interlayer and interlayer: DLC versus the bond strength between substrate: DLC alone, and (2) reduction in residual stress. Both attributes act to increase the total adhesion strength. The interlayer is typically deposited to thickness ranging between 0.2 and 2 µm but can also be successfully applied thicker as per D. Lusk, et al., "Thick DLC films deposited by PECVD on the internal surface of cylindrical substrates", the disclosure of which is incorporated herein in its entirety.

There are several methods for producing a well-adhered DLC coating with the properties desired for firing weapons. It is well-documented that the sp3 bonding percentage is highly dependent on the total energy per depositing C atom, where a total energy of ~100 eV per depositing C atom will maximize sp3 bonding percentage as per Robertson, "Diamond-like amorphous Carbon" p. 141 and p. 211 incorporated herein by reference in its entirety. Therefore this guidance can be used to ensure the appropriate bias voltage is being used to obtain the appropriate sp3 bonding percentage and associated properties independent of system geometry and precursor gas.

An example method to obtain a bonded DLC coating with the optimal properties employs plasma-enhanced chemical vapor deposition on steel firing weapon parts with the following steps:

1. The parts are cleaned and degreased 110 by ultrasonic agitation in successive baths containing first a degreasing detergent solution and second deionized water followed by blowing dry with dry nitrogen.
2. If the surface of the parts contain any remaining scale or rust, they are abrasive grit blasted 120 per the specification published as TT-C-490, "Chemical Conversion Coatings and Pretreatments for Metallic Substrates" Method 1, (available at www. quicksearch.dla.mil), the disclosure of which is incorporated herein in its entirety. Otherwise, proceed with the steps listed below.
3. The parts are final cleaned 130 by ultrasonic agitation in successive baths containing a (1) alkaline solution, (2) water buffer, and finally (3) deionized water followed by blowing dry with dry nitrogen.
4. The parts are protected from surface contamination by transporting with nitrile gloves or equivalent and immediately fixtured 210 into the vacuum chamber for deposition. A non-critical surface is used for electrical connection 215 of the part to an external power supply. The part is capacitively coupled to a grounded electrode to enable formation of a plasma.
5. The chamber is purged by closing and vacuum pumping said chamber to a pressure of $\leq 2\times 10^{-4}$ Pa 220.
6. The part is heated to a temperature of 400° F. for 30 minutes to bake-off any residual volatiles and moisture and then dropped to a deposition temperature of 300 OF for the remainder of the process 230 as excessive heating can result in self-annealing of the depositing carbon resulting in higher sp2 content than desired as per Chhowalla, et al., "Influence of ion energy and substrate temperature on the optical and electronic properties of tetrahedral amorphous carbon (ta-C) films", the disclosure of which is incorporated herein in its entirety.
7. The vacuum chamber is backfilled with a 90%:10% Argon/Hydrogen plasma cleaning gas mixture through use of mass flow controllers to a chamber pressure of 5 Pa as per C. Chouquet, et al., "Structural and mechanical properties of a-C:H and Si doped a-C:H thin films grown by LF-PECVD" and S. J. Bull, "Techniques for improving thin film adhesion", the disclosures of which are incorporated herein in its entirety. A radio-frequency (RF) power supply is used to apply a bias to the part to ignite a plasma between the grounded electrode with a voltage of 350 V. The part is plasma cleaned 240 to remove surface oxides for a time of 20 minutes.
8. After the plasma cleaning glow discharge is extinguished, the vacuum chamber is purged by pumping out the plasma cleaning gas mixture followed by immediate introduction of a Argon/Tetramethylsilane gas mixture in the typical range of 50%:50% to 80%:20% using mass flow controllers with evaporator operating at 40° C. for the TMS to a chamber pressure of 1-70 Pa for deposition of the initial adhesion interlayer 250. A RF power supply is used to apply a bias to the part to ignite a plasma with a voltage of 450-650 V. The layer is deposited to a total thickness of 2 µm.
9. After the adhesion interlayer plasma is extinguished, the vacuum chamber is purged by pumping out the adhesion cleaning gas mixture followed by immediate introduction of a Argon/Acetylene/TMS gas mixture with a 30%-50% Argon content with the balance being Acetylene/TMS in the typical ratio range of 4:1 to 10:1 260 using mass flow controllers to a chamber pressure of 1-70 Pa for deposition of the initial Si-doped DLC layer. A RF power supply is used to apply a bias to the part to ignite a plasma with a voltage in the range of 450-650 V 270. Following deposition 280 of the initial Si-doped DLC layer to a thickness of 2 µm, the TMS flow is shut off, for deposition of an un-doped DLC layer to be deposited to an additional 2 µm. The TMS flow is reintroduced, for a second Si-doped DLC layer to be deposited to an additional 2 µm. The deposition is completed with a minimum of one additional un-doped DLC layer to achieve a total coating thickness of 10 µm with a low compressive residual stress of <2 GPa.
10. After the carbon deposition plasma is extinguished 290, the vacuum chamber is purged by pumping out the deposition gas mixture and the part is allowed to cool 295 to less than 50° C. The chamber is back-filled with dry nitrogen to atmospheric pressure, opened, and the parts are removed 300, completing the process.

ASTM B571-97 Adhesion Testing Standard.

The ASTM B571-97 standard, incorporated herein in its entirety, provides for qualitative testing of adhesion coatings on metallic surfaces. Compliance with this standard requires a perfect or satisfactory result. The methods for testing the adhesive strength of coatings includes 1) bend tests, 2) burnishing test, 3) chisel-knife test, 4) draw test, 5) file test, 6) grind-saw test, 7) heat-quench test, 8) impact test, 9) peel test, 10) push test, and 11) scribe-grid test. If applying any of the above testing parameters results in peels. flakes, or lifts the coating from the substrate, then the adhesion is unacceptable or less than perfect.

Adhesion of the DLC coat bonded on the metallic surfaces of the firing weapon as described herein must be considered acceptable under ASTM B571-97, paragraph 13.1—"scribe-grid" test. The scribe-grid test parameters requires scribing three or more parallel lines on a rectangular grid pattern on the DLC bonded firing weapon. The parallel lines are scribed using a hardened steel tool ground to a sharp (30°) point with a distance between the scribed lines of approximately ten times the minimal coating thickness, and having a minimum distance of 0.4 mm. In scribing the lines, sufficient pressure is used to cut through the coating to the substrate in a single stroke. If any portion of coating between the lines breaks away from the substrate, the adhesion is inadequate and therefore unacceptable.

ASTM B117 Corrosion Testing Standard.

ASTM B117-2011 Corrosion Testing Standard—The ASTM B117-2011 standard, incorporated herein in its entirety, provides for the test apparatus, procedure, and test conditions for administering the salt fog test to quantify the corrosion resistance of a coating applied to a metallic substrate. The parameters for administering the continuous salt fog test (or option of administering a salt fog test that alternates between 24 hours on and 24 hours off for the duration of the test) include a 5% salt solution concentration, positioning the test specimens at an angle of between 15° and 30° from the vertical, maintaining exposure zone temperature between 92° F. and 98° F., and maintaining pH between 6.5 and 7.2.

The ASTM B117-2011 continuous corrosion test (option to alternate between 24 hours on and 24 hours off for the duration of the test) duration for the DLC coating shall be 96-3000 hours, with a narrower range of 240-3000 hours. Compliance with this standard requires no red rust on ferrous substrates upon completion of the corrosion test. If any red rust appears on the ferrous substrate during the test, then the corrosion resistance is considered unacceptable.

Operating Components.

The DLC coating coat may be applied to any metallic surface of a military firing weapon such as the M4, M16, M249, M240, Mk19, Mk48, Mk46, AK-47, and any commercial hand or shoulder firing weapons such as pistols, shotguns, AR-15's, AR-10's, etc. as well as other military and its civilian counterparts well known in the art. Those operating components of a firing weapon that require lubrication are preferred parts for DLC bonding. Such operating parts include: 1) the upper receiver assembly, 2) carrying handle and upper rail, 3) bolt carrier assembly, 3) lower receiver assembly, 4) adjustable rear sight, and 5) the back-up iron sight.

Figure 4:
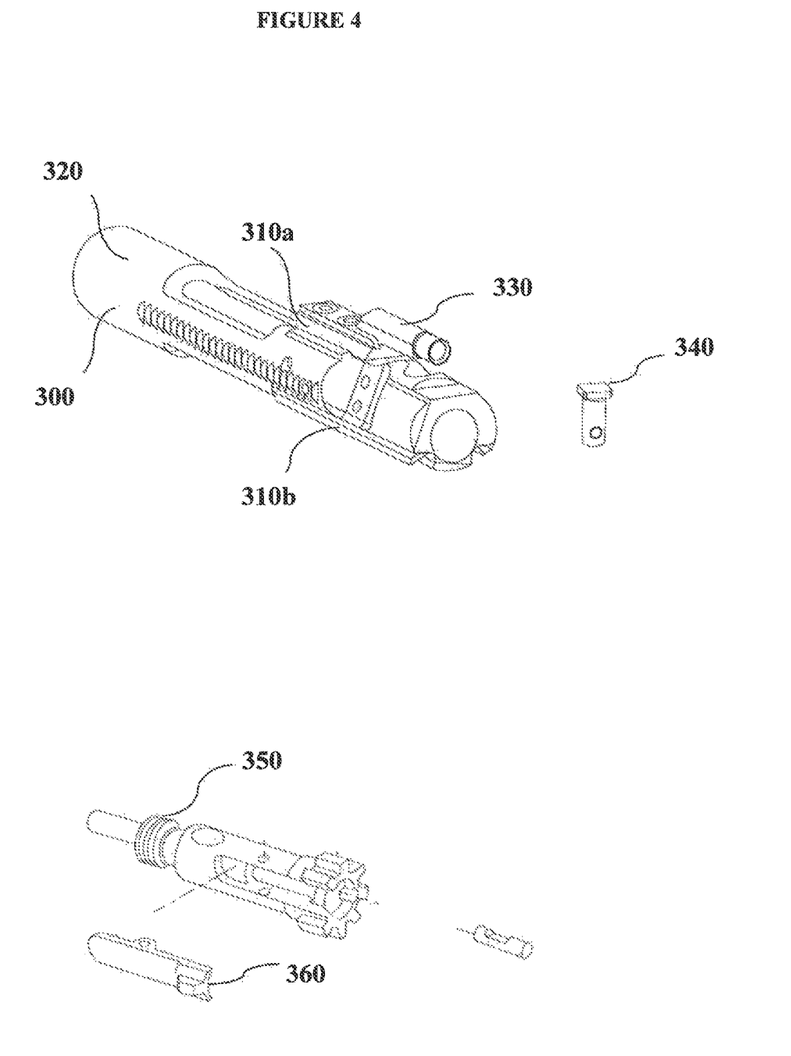
FIG. 4 is a representative illustration of a bolt carrier assembly.

In an exemplary embodiment, a bolt carrier assembly as illustrated in FIG. 4 is bonded with DLC. The bolt carrier assembly including the bolt carrier 300, bolt 350 and receiver. The bolt carrier 300 may further include one or more rails 310a and 310b that may extend along the lateral length of the main body 320. The rails 310a and 310b form a slight protrusion extending from the main body 320, thereby acting as contact points when the bolt carrier reciprocates. Rails 310a and 310b may be disposed either near the top 310a, adjacent to the carrier key 330, or on the bottom 310b.

Figure 5:
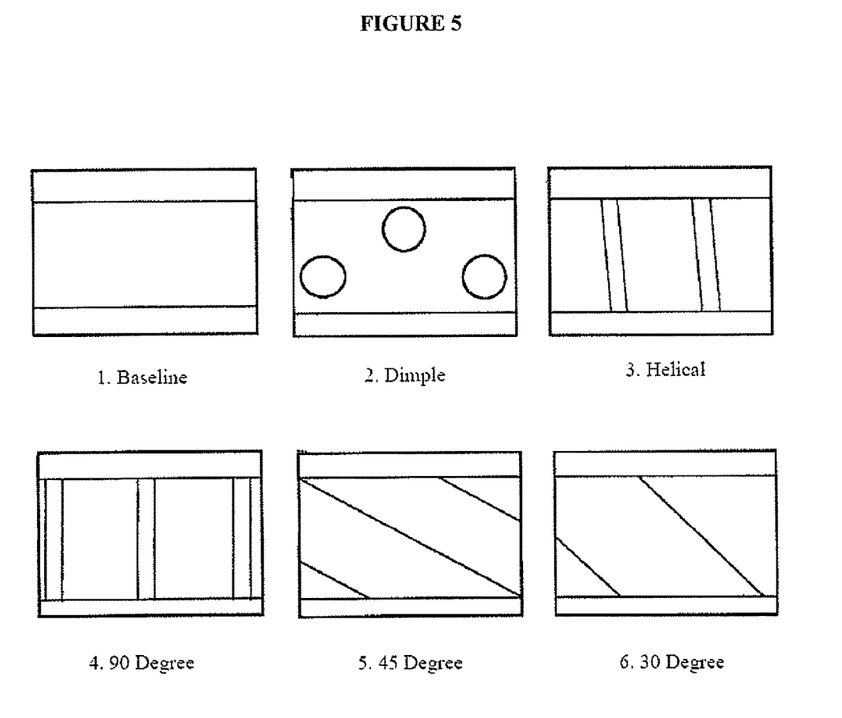
FIG. 5 is a representative illustration of various surface modifications of bolt carrier rails.
Figure 6A:
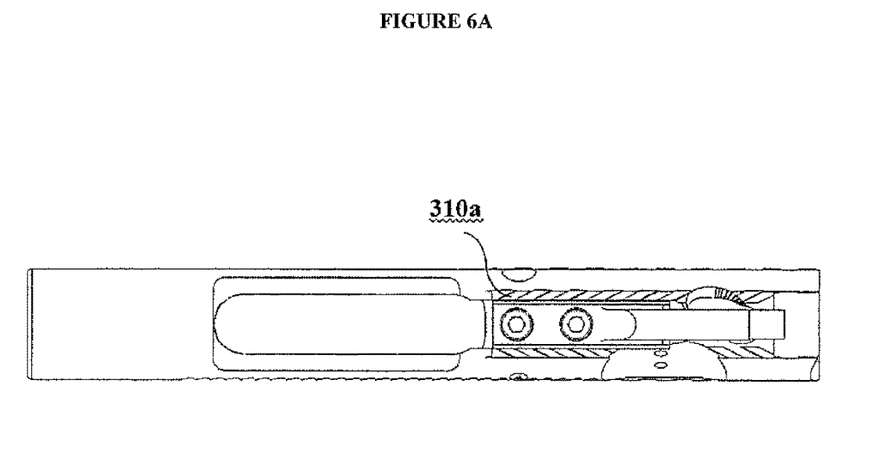
FIG. 6A is a top view of a representative DLC bonded bolt carrier assembly having a plurality of angled channels on the rails.
Figure 6B:
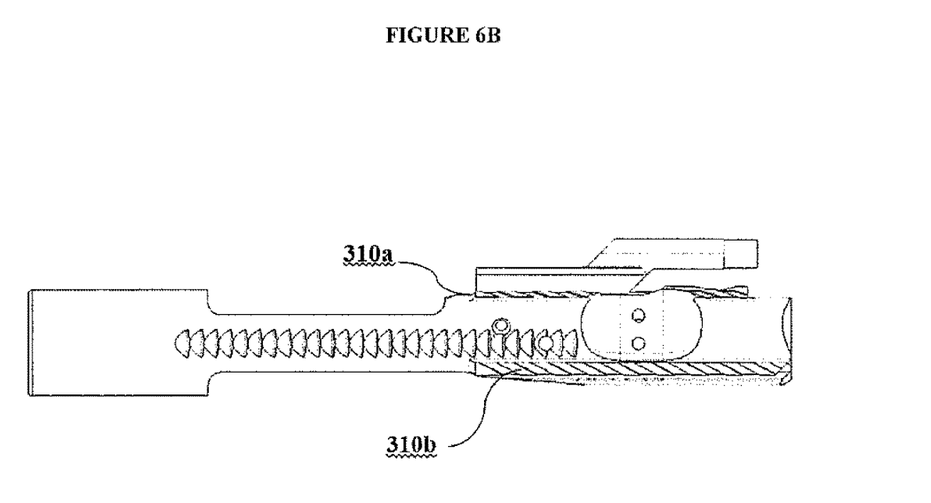
FIG. 6B is a side view of a representative DLC bonded bolt carrier assembly having a plurality of angled channels on the rails.

As illustrated in FIG. 4, the top rails 310a may extend continuously from a rear end of the bolt carrier key 330 to the front end of the bolt carrier key or even beyond, to the front of bolt carrier. The rails 310a and 310b may be a contiguous flat piece (e.g. baseline) or surface modified with dimples, helical, straight (90 degree angles) or preferably angled channels (30 and 45 degree angles) as illustrated in FIG. 5. Modification of the rail with such channels improves the reliability of the weapon in sand/dust environments through reduced jamming by diverting the sand/grit/dust away from the critical sliding contact points. Angled channels may have angles between 0° to 90° in either the forward or backward facing direction. Preferably the angles are about 30° and 45°. Suggested width of the angled channels may be about 0.05 inches to 0.225 inches, and 0.001 to 0.05 inches in depth. Surface modifications as illustrated herein may be made on the top rails alone, the bottom rails, or both. FIG. 6A (top view) and FIG. 6B (side view) are exemplary bolt carrier assemblies bonded with DLC coating having rails 310a and 310b surface modified with angled channels.

Embodiments and Testing

Twenty five sets of M4A1 parts including the bolt carrier 300, bolt extractor 360, cam pin 340, carrier key, forward assist, ejector port and upper receiver were bonded with the DLC coating and the bolt carrier rails were further modified with 30-45 degree angled channels. The coated parts meet the parameters in Table 1.

TABLE 1

Parameters for Operational Components of Firing Weapons bonded with DLC.

| | |
|---|---|
| Hardness: | 8-20 GPa |
| Coefficient of friction: | <0.2 in dry sliding |
| Coating thickness | 10-20 microns |
| Maximum Operating Temperature | 400° C. |
| Color: | Grey-black |
| Corrosion: | 240 hours ASTM B117 |
| Adhesion | ASTM B572 compliant |

The weapons were then subjected to 1) ambient endurance, 2) sand/dust, 3) hot/cold. 4) salt fog, and 5) un-lubricated endurance testing. Testing parameters and results are described below.

Ambient Endurance Testing:

The operating components were subjected to ambient endurance testing in accordance with testing procedures described in TOP 3-2-045, Section 4.3 (available at www.dtic.mil), which is incorporated herein in its entirety. The baseline M4A1 weapon was lubricated with cleaner, lubricant, preservative (CLP) in accordance with known procedures. A total of 15,000 rounds of ammunition were fired on each weapon in 120 round cycles. Cyclic rate of fire and any malfunctions that occurred were recorded throughout the test. The DLC treated weapon performed better than the baseline CLP lubricated weapon. The DLC weapon demonstrated a 95% increase in reliability; 7,000 Mean Rounds between Stoppage (MRBS) vs. the baseline CLP lubricated weapon threshold of 3,594 MRBS. DLC weapons also maintained more consistent cyclic rates compared to the baseline CLP lubricated weapon. There was no observable wear or buildup on any of the sliding surfaces of the DLC weapons. The DLC weapons showed significantly less wear on all sliding surfaces (less than 5% exposed substrate on all surfaces) vs. the baseline CLP lubricated weapon (75% exposed substrate on the bolt carrier and 90% exposed substrate on the bolt). DLC weapons also maintained more consistent cyclic rates where the baseline tended to increase with rounds fired. DLC weapons also maintained more consistent cyclic rates where the baseline tended to increase with rounds fired.

Sand/Dust Testing:

The operating components were subjected to sand/dust testing in accordance with testing procedures described in TOP 3-2-045, Section 4.5.4 (available at www.dtic.mil), which is incorporated herein in its entirety. The baseline M4A1 weapon was lubricated with a heavy application of cleaner, lubricant, preservative (CLP) in accordance with known procedures. The baseline and DLC bonded weapons were conditioned with blowing dust for 30 minutes initially and between firing cycles. A total of 360 rounds of ammunition were fired on each weapon in 120 round cycles. Cyclic rate of fire and any malfunctions that occurred were recorded throughout the test. The DLC treated weapon performed equal to the baseline CLP lubricated weapon. Each weapon experienced 3 stoppages.

Hot/Cold Testing: Environmental testing was conducted in accordance with testing procedures described in TOP 3-2-045, Section 4.5, Adverse Conditions (available at www.dtic.mil), which is incorporated herein in its entirety. For hot testing, weapons and ammunitions were conditioned initially at 160° F. for a minimum of 8 hours and then reconditioned for a minimum of 1 hour between firing sequences. A total of 1200 rounds of M855 ammunition were fired per weapon in 120 round cycles. For cold testing, weapons were conditioned initially at −60° F. for a minimum of 8 hours and then reconditioned for a minimum of 2 hours between firing sequences. A total of 1200 rounds were fired per weapon in 120 round cycles. The baseline M4A1 weapons were initially lubricated and the re-lubricated after 600 rounds with CLP or Lubricant Artic Weather (LAW). Cyclic rate of fire and malfunctions were recorded throughout the test. For hot testing, the DLC weapon performed better than the baseline CLP lubricated weapon. The DLC weapon had zero stoppages in 1200 rounds, compared to 4 stoppages on the baseline weapon. The DLC weapons also maintained more consistent cyclic rates where the baseline tended to increase with rounds fired. There was no observable wear or buildup on any of the sliding surfaces of the DLC weapons.

Salt/Fog Testing:

Salt fog testing was conducted in accordance with testing procedures described in TOP 3-2-045, Section 4.5.7 (available at www.dtic.mil), which is incorporated herein in its entirety. A total of three M4A1 carbines were used for the test. The first weapon was a new standard M4A1 carbine, the second weapon was a standard M4A1 carbine that had 6,000 rounds in a previous test, and the third weapon was a M4A1 carbine with a DLC coated upper receiver and bolt carrier assembly that had fired 6,000 rounds in a previous test. The testing consisted of 24-hour exposures to the salt fog environment alternated with 24-hour drying periods, for a total of 96 hours. The standard weapons were cleaned and lightly lubricated before beginning the test. The DLC weapon was cleaned and left in a dry condition (no lubrication). After each 48-hour period, the weapons were removed and live fire testing was conducted. Digital images were taken of the weapon exterior and critical operating group components to compare each test group. No observable corrosion was seen on the DLC treated weapon after 48 and 96 hours of salt/fog treatment, whereas significant corrosion was observed with the untreated weapon which was impossible to remove. Salt on the DLC treated parts was easily removed by rinsing the components in water.

Un-Lubricated Endurance Testing:

An un-lubricated test was conducted according to the testing procedures described in IAW section 4.22 of TOP 3-2-045 (available at www.dtic.mil), which is incorporated herein in its entirety. This subtest is an indication of a weapon's ability to function under adverse conditions, particularly in those circumstances when scheduled lubrication cannot be accomplished. All lubrication was removed from the baseline weapon prior to testing. Each weapon, including the baseline weapon was fired completely dry, without any maintenance or cleaning intervals. Typical reliability and durability test firing schedules were used with regular cooling intervals. In un-lubricated tests, degradation in weapon performance is common. Each weapon was fired with ammunitions until greater than 3 malfunctions occurred within one 30 round magazine. For the baseline weapon, a steady drop in cycle rate was observed and over the last two 30 round magazines, the weapon experienced malfunctions every other round. Significant fouling was evident on the baseline M4A1 operating group components. In contrast, the weapons bonded with DLC coating fired up to 3.75× as many rounds compared to the untreated baseline without any stoppages and no systematic drop in cyclic rate. Firing could have continued further but testing was stopped due to resource limitations. Overall, the cyclic rates for both DSL weapons were more consistent than the baseline M4A1 throughout the test. In comparison with the untreated baseline, no wear was observed on any of the sliding surfaces on the DLC treated weapons.

While the invention has been described with reference to certain preferred embodiments, numerous changes, alternations and modifications to the described embodiments are possible to those skilled in the art without departing from the spirit and scope of the invention as defined in the appending claims, and equivalents thereof.

What is claimed is:

1. A firing weapon operating component, wherein said operating component is an upper receiver assembly, or a bolt carrier assembly, and wherein the operating component comprises a metallic contact surface bonded with 1 μm-25 μm thick layer of an amorphous, solid, diamond-like carbon coating comprising 80%-60% carbon and 20%-40% hydrogen, wherein said carbon comprises 25%-50% sp3 bonded carbon and 50%-75% sp2 bonded carbon, wherein the coating has a hardness level of 8-20 GPa, and less than 0.2 a coefficient of friction in dry sliding, and a maximum operating temperature of 400° C., and wherein adhesion of the diamond-like carbon bonded coating to the metallic contact surfaces is compliant with ASTM B571, paragraph 13.1, scribe test standard.

2. The firing weapon operating component of claim 1, wherein the solid, diamond-like carbon coating meets about 96-3000 hours of corrosion testing with no red rust under the ASTM B117 standard.

3. The firing weapon operating component of claim 2, wherein the solid, diamond-like carbon coating meets about 240-3000 hours of corrosion testing with no red rust under the ASTM B117 standard.

4. The firing weapon operating component of claim 1, wherein the amorphous, solid diamond-like carbon coating is 10-20 μm thick and the coating comprises 65%-75% carbon and 25%-35% hydrogen, and wherein said carbon comprises 30%-40% sp3 bonded carbon and 70%-60% sp2 bonded carbon.

5. The firing weapon operating component of claim 1, further comprising an adhesion interlayer between the diamond-like carbon coat and the metallic contact surfaces.

6. The firing weapon operating component of claim 1, wherein the adhesion interlayer comprises Cr, W, Mo, Si.

7. The firing weapon operating component of claim 1, wherein the solid diamond-like carbon coating further comprises a dopant selected from metallic elements or non-metallic elements or mixtures thereof.

8. The firing weapon operating component of claim 7, wherein the non-metallic elements are selected from the group consisting of B, Si, N, Ge, and F.

9. The firing weapon operating component of claim 7, wherein metallic elements are selected from the group consisting of Ti, Cu, and W.

10. The firing weapon operating component of claim 1, wherein the operating component is a bolt carrier assembly, wherein the assembly comprise a bolt carrier having at least one pair of rails along the body of the bolt carrier, wherein said rails comprises a plurality of 0 to 90 degree angled channels.

11. The bolt carrier of claim 10, wherein said rails comprises a plurality of 30 or 45 degree angled channels.

12. The bolt carrier of claim 10, wherein said bolt carrier meets the requirements of TOP 3-2-045, section 4.5.4.

13. The bolt carrier of claim 10, wherein the angled channels have a width of 0.005 inches to 0.225 inches.

14. A process for preparing the operating component of claim 1 comprising bonding the carbon by plasma enhanced chemical vapor deposition (PECVD).

15. A process for bonding the DLC on the operating component of claim 1 comprising:
   a. fixturing the operating component in a vacuum chamber;
   b. heating the component to 200-550° F.;
   c. pressurizing the vacuum chamber with a process gas;
   d. applying bias voltage to the operating component;
   e. energizing the chamber to create plasma to deposit carbon on the operating component.

16. A process for bonding the DLC on the operating component of claim 1 comprising:
   a. fixturing the operating component in a vacuum chamber;
   b. heating the component to 200-550° F.;
   c. pressurizing the vacuum chamber with a process gas, wherein the carbon precursor process gas is selected from the group consisting of methane ($CH_4$), acetylene ($C_2H_2$), ethane ($C_2H_6$), ethylene ($C_2H_4$), propane ($C_3H_8$), hexane ($C_6H_{14}$), cyclohexane ($C_6H_{12}$), pentane ($C_5H_{12}$), butane ($C_4H_{10}$), and benzene ($C_6H_6$), where the preferred precursor gas is acetylene,
   d. applying bias voltage to the operating component;
   e. energizing the chamber to create plasma to deposit carbon on the operating component.

17. A process for bonding the DLC on the operating component of claim 1 comprising:
   a. fixturing the operating component in a vacuum chamber;
   b. heating the component to 200-550° F.;
   c. pressurizing the vacuum chamber with a process gas and a dopant wherein the dopant is silicon or germanium;
   d. applying bias voltage to the operating component;
   e. energizing the chamber to create plasma to deposit carbon on the operating component.

18. A process for bonding the DLC on the operating component of claim 1 comprising:
   a. fixturing the operating component in a vacuum chamber;
   b. heating the component to 200-550° F.;
   c. depositing a carbide forming adhesion layer;
   d. pressurizing the vacuum chamber with a process gas;
   e. applying bias voltage to the operating component.

19. The process of claim 14, wherein the amorphous, solid diamond-like carbon coat is deposited at low stress level of <2 GPa achieved through multi-layering with the multi-layer thickness range of 0.01-10 µm.

* * * * *